US007184907B2

(12) United States Patent
Chun

(10) Patent No.: US 7,184,907 B2
(45) Date of Patent: Feb. 27, 2007

(54) APPARATUS AND METHOD TO DETECT AN INTRUSION POINT ALONG A SECURITY FENCE

(75) Inventor: Hong Gi Chun, Seoul (KR)

(73) Assignee: Fomguard Inc., Seoul (KR)

( * ) Notice: Subject to any disclaimer, the term of this patent is extended or adjusted under 35 U.S.C. 154(b) by 234 days.

(21) Appl. No.: 10/713,425

(22) Filed: Nov. 17, 2003

(65) Prior Publication Data

US 2005/0107968 A1 May 19, 2005

(51) Int. Cl.
*G01R 13/00* (2006.01)
*G01R 29/26* (2006.01)

(52) U.S. Cl. .......................................................... 702/69

(58) Field of Classification Search .................. 702/69; 340/566, 552, 541; 385/12
See application file for complete search history.

(56) References Cited

U.S. PATENT DOCUMENTS

| | | | | |
|---|---|---|---|---|
| 4,275,294 | A | 6/1981 | Davidson | |
| 4,371,869 | A | 2/1983 | Davidson | |
| 4,399,430 | A | 8/1983 | Kitchen | |
| 4,450,434 | A | 5/1984 | Nielsen et al. | |
| 4,558,308 | A | 12/1985 | Ciordinik et al. | |
| 4,676,485 | A | 6/1987 | Ciordinik et al. | |
| 4,680,573 | A | 7/1987 | Ciordinik et al. | |
| 5,134,386 | A | 7/1992 | Swanic | |
| 5,198,799 | A * | 3/1993 | Pascale | 340/552 |
| 5,416,467 | A | 5/1995 | Ohata et al. | |
| 5,434,557 | A | 7/1995 | Alizi | |
| 5,446,446 | A * | 8/1995 | Harman | 340/566 |
| 5,592,149 | A | 1/1997 | Alizi | |
| 6,646,551 | B2 * | 11/2003 | Perry | 340/564 |
| 6,646,563 | B1 * | 11/2003 | Buckley et al. | 340/668 |
| 6,731,210 | B2 * | 5/2004 | Swanson et al. | 340/566 |
| 2003/0151509 | A1 * | 8/2003 | Iannotti et al. | 340/541 |
| 2004/0071382 | A1 * | 4/2004 | Rich et al. | 385/12 |
| 2005/0024208 | A1 * | 2/2005 | Maki et al. | 340/545.3 |
| 2005/0024210 | A1 * | 2/2005 | Maki | 340/566 |

FOREIGN PATENT DOCUMENTS

| | | |
|---|---|---|
| KR | 1997-0009968 | 6/1997 |
| KR | 20-0205489 | 12/2000 |
| KR | 20-0205490 | 12/2000 |

* cited by examiner

*Primary Examiner*—Bryan Bui
*Assistant Examiner*—Aditya S. Bhat
(74) *Attorney, Agent, or Firm*—Birch, Stewart, Kolasch & Birch, LLP

(57) ABSTRACT

A monitoring system evaluates the integrity of a fiber optic cable, having a weave pattern and being attached to a security fence. To establish and calibrate the monitoring system, the present invention provides a system and method for establishing a look-up table to be stored in a memory. Any breakage in, bending of, or stress on the fiber optic cable is noted by the monitoring system by an alarm, and a length of cable between the monitoring system and the affected portion of the fiber optic cable is determined. The look-up table is indexed to determine a zone of potential breach. Further, an average weave density of the affected zone is computed, so that an approximate location of the potential breach within the affected zone, in terms of ground distance, can be accurately determined and displayed.

19 Claims, 6 Drawing Sheets

APPARATUS AND METHOD TO DETECT AN INTRUSION POINT ALONG A SECURITY FENCE

BACKGROUND OF THE INVENTION

1. Field of the Invention

The present invention relates to a security fence of the type employing a fiber optic cable to detect intrusion or tampering. Further, the present invention relates to a method and apparatus for calibrating and initializing such a system, so that the system accurately approximates an intrusion or tampering location along the security fence.

2. Discussion of the Related Art

Security fences are widely used today. For example, security fences usually surround the perimeters of military facilities, some government agencies, airports, residences of celebrities and politicians, and other such areas. Simple fences are effective in alerting an innocent passerby that a certain area is restricted. Deterrent fences, such as fences with barbed wire, razor wire, or electrical currents therein, can also be effective at deterring less determined persons, such as children and vagabonds, from crossing into the restricted area. However, determined individuals, such as criminals and terrorists, may easily bypass deterrent fences by using common tools, such as wire or bolt cutters to simply make a passageway therethrough.

A first attempt to address the concern of determined individuals entering a restricted, fenced area was the employment of monitoring schemes. Security guards, cameras, and watch dogs, to name a few, were used to monitor the fence perimeter. However, such conventional monitoring systems are far from foolproof, as humans and animals can be distracted and often do not monitor closely due to boredom.

An improvement in the art came with the advent of employing fiber optic cable in conjunction with a security fence. FIG. 1 shows a section of a security fence 1, in accordance with the background art. The security fence extends from a first end 3 to a second end 5. Such a security fence is formed by interlocked galvanized metal wires attached to support posts 2, and is commonly referred to as a "chain-link" fence. Of course, a protected area would be surrounded by a plurality of such fence sections, which abut, or are closely adjacent to, one another.

A fiber optic cable 7 is woven into an overall pattern and attached to each section of the security fence 1 at a plurality of locations along the section of the security fence 1. FIG. 2 is close-up view of fiber optic cable 7 of the security fence 1. FIG. 2 illustrates the overall weave pattern of the fiber optic cable 7. Six columns and five rows of the weave pattern are illustrated, however in practice, there could be thousands of columns and dozens of rows in a weave pattern covering a complete security fence section 1. The galvanized wires have been removed to simplify the illustration. The fiber optic cable 7 is attached to the security fence 1 by a plurality of clips 9. As illustrated in FIG. 3, the clips 9 connect one portion of the fiber optic cable 7 to another portion of the fiber optic cable 7, and also attach the fiber optic cable 7 to galvanized wires 6 of the security fence 1.

As illustrated in FIG. 2, a light is piped into one end 12 of the fiber optic cable 7 via a source/receiver, known as a transceiver 10 or ODTR. The light passes through the fiber optic cable 7 until it reaches the other end 14 of the fiber optic cable 7. At the other end, the light is reflected off of a termination and returns back to the transceiver 10. In practice, the weave pattern of FIG. 2 would be continuous all over the security fence 1, and the one end 12 of the fiber optic cable 7 would reside at the first end 3 of the security fence 1. Likewise, the other end 14 of the fiber optic cable 7 would reside at the second end 5 of the security fence 1.

The time delay between the transmission of the light and the return of the reflected light is indicative of the length of the fiber optic cable 7. A typical length of the fiber optic cable 7 might be 5,000, 10,000 or even 20,000 meters (m). If the cable is disturbed (e.g. cut by a tool or bent sharply as by climbing), the transmission of light therethrough is interrupted. The interruption causes the transmitted light to be partially or completely stopped before reaching the other end 14 of the fiber optic cable 7, and instead causes the transmitted light to be reflected back to the transceiver 10 from the point of the cut or sharp bend.

The transceiver 10 constantly monitors the time delay between transmitting light and receiving reflected light back. If the measured time delay remains within a threshold value of a standard time delay, indicative of the light reaching the other end 14 of the cable, the transceiver 10 knows that the fiber optic cable 7 remains unmolested (e.g. uncut and unbent). If the time delay varies outside of the threshold value, e.g. less than the standard time delay, the transceiver 10 assumes that an uncommon event has occurred, and an alarm is raised.

Because of the nature of the speed of light and electronic circuits, the alarm is raised at almost the same instant as the breaching of, or tampering with, the fence. However, it should be noted that the length of fence being monitored by the system is usually quite long. For example, one transceiver 10 can monitor a fence up to and perhaps exceeding one mile (1.6 kilometers) in length. In most circumstances, such a fence is too long to be monitored by a person or camera from a single vantage point.

Initially, it is important to gain at least a general idea of the potential breach (PB) point along the fence from the transceiver 10. By knowing the general area of the PB, it is possible to have a quick response by personnel to the area of a PB. Further, it is possible to quickly activate and/or aim a camera to the general area of the PB.

Later, it is also very important to have a more specific idea of the PB point in order to facilitate inspection and servicing of the fiber optic cable 7 to ensure/restore its operability. If the fiber optic cable 7 has been cut, it is important to "know" a location of the cut with some precision, so as to facilitate its timely repair. If a general location of the cut in the fiber optic cable is only known to within plus or minus 30 meters, it can take several people a long time to trace or follow the weave pattern and try to discern the cut or damaged portion of the fiber optic cable 7, so that the cable can be repaired.

To locate a PB, the background art employs an arithmetic approach, as will now be explained. A signal is introduced into the first end 12 of the fiber optic cable 7 and initially travels along the security fence 1 toward a termination at the second end 14 of the fiber optic cable 7. The initial travel direction has been indicated by arrows in FIG. 2. After reaching the termination, the light is reflected at the second end 14, and travels back to the transceiver 10. No arrows for the reflected light are included in FIG. 2, in order to simplify the illustration.

The transceiver 10 monitors the time delay between the transmission of a light signal and the reception of the reflected light signal. The time delay can be converted into a length measurement by multiplying the time delay by the speed of the light transmitted through the fiber optic cable 7 (which is a known value), and dividing that product by two. Under normal circumstances (e.g. no cut or bending stress in the fiber optic cable 7), the distance calculated by the transceiver 10 will be the cable's total length (TL), otherwise the length will be a shorter value and will indicate a length of cable prior to the PB point in the fiber optic cable 7. This length will be referred to as the cut length (CL).

To locate the ground distance (GD) from the first end 3 of the security fence 1 to the potential breach/bend (PB) in the fiber optic cable 7, the transceiver 10 starts with the measured CL, and then subtracts a dummy cable length (DCL), which extends between the transceiver 10 and the start of the security fence 1. Next, the outcome is divided by the cable length used per meter of ground length (CLM). The CLM is an average value, which is highly dependent upon such factors as the shape of the weave pattern selected (which is diamond shaped in FIG. 2), the closeness or density of the pattern, and the height of the security fence 1. In some instances, CLM could equal 25 meters of cable per one meter of ground distance. The equation to estimate the ground distance (GD) from the start of the fence to the potential breach (PB) in the fiber optic cable 3 is: GD=(CL–DCL)/CLM.

Authorized personnel use the ground distance (GD) as a general guide to quickly respond to a potential breach (PB). For example, a security guard would be alerted to a potential break-in at 1,113 meters from the start point of the fence. The guard would then quickly proceed to a point in the neighborhood of 1,113 meters from the start of the fence in an attempt to intercept the breaching party. Later, the service personnel would attempt to exactly locate a point along the fence, which is approximately 1,113 meters from the start point of the fence, so that the fiber optic cable 3 could be inspected and repaired, as needed.

The background art, described above, suffers several drawbacks. First, it is difficult to locate points along a fence line based upon a known distance from a start point of the fence. If the distance is long, it is tedious to measure such a distance, and the measurement is prone to error. Further, obstacles along the fence line can further hinder a measurement from the start of the fence.

Second, the value CLM, which represents an average cable length used per meter of ground length, is a very troublesome value. In order for the ground distance (GD) to be accurately calculated, the CLM must remain relatively constant along the length of the fence. In other words, the actual CLM at any point along the fence should remain at, or very near to, the value of the average CLM for the entire fence, which is used in the equation to calculate the ground distance (GD).

In reality, it is very difficult to maintain a relatively constant CLM along the entire length of the fence line. For example, the height of the fence may vary to accommodate terrain changes. Further, it is difficult, and hence time consuming and expensive, to maintain a constant weave density for the weave pattern of the fiber optic cable 3. Therefore, there exists a need in the art for an improved system and method of calculating a ground distance (GD) to a potential breach (PB) point in a fiber optic cable enhanced, security fence, such as the security fence 1 illustrated in FIG. 1.

SUMMARY OF THE INVENTION

It is an object of the present invention to address one or more of the drawbacks associated with the background art.

The present invention offers an improved system and method for locating a potential breach in a fiber optic cable enhanced, security fence. The present invention discloses an improved system and method, which allows security personal to more quickly appreciate a general location of a potential breach (PB) in the security fence, and to more accurately locate the PB for later inspection, service and repair.

Further, the present invention offers a system and method to initialize and calibrate a system for detecting a location of a potential breach along a security fence.

These and other objects are accomplished by a system and method for establishing a look-up table to be used by a monitoring system for monitoring a security fence. The monitoring system evaluates the integrity of a fiber optic cable, having a weave pattern and attached to a security fence. Any breakage in, bending of, or stress on the fiber optic cable is noted by the monitoring system, and a length of cable between the monitoring system and the affected portion of the fiber optic cable is determined. The look-up table is indexed to determine a zone of potential breach. Further, an average weave density of the affected zone is computed, so that an approximate location of the potential breach within affected zone, in terms of ground distance, can be accurately determined and displayed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF PREFERRED EMBODIMENTS

Figure 1:
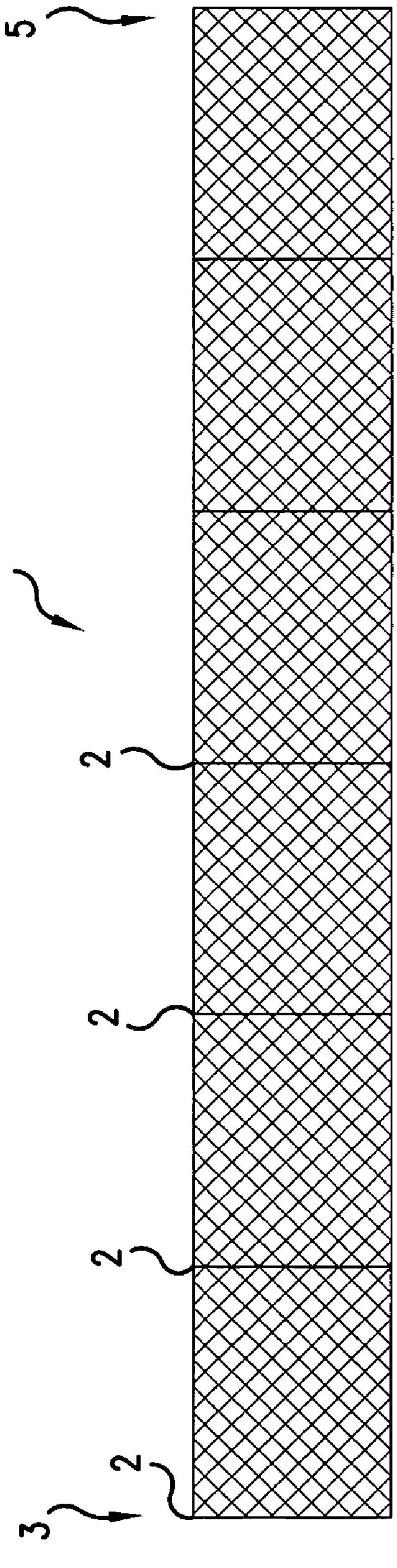
FIG.1 BACKGROUND ART
FIG. 1 is a perspective view of a chain-link security fence, in accordance with the background art.
Figure 2:
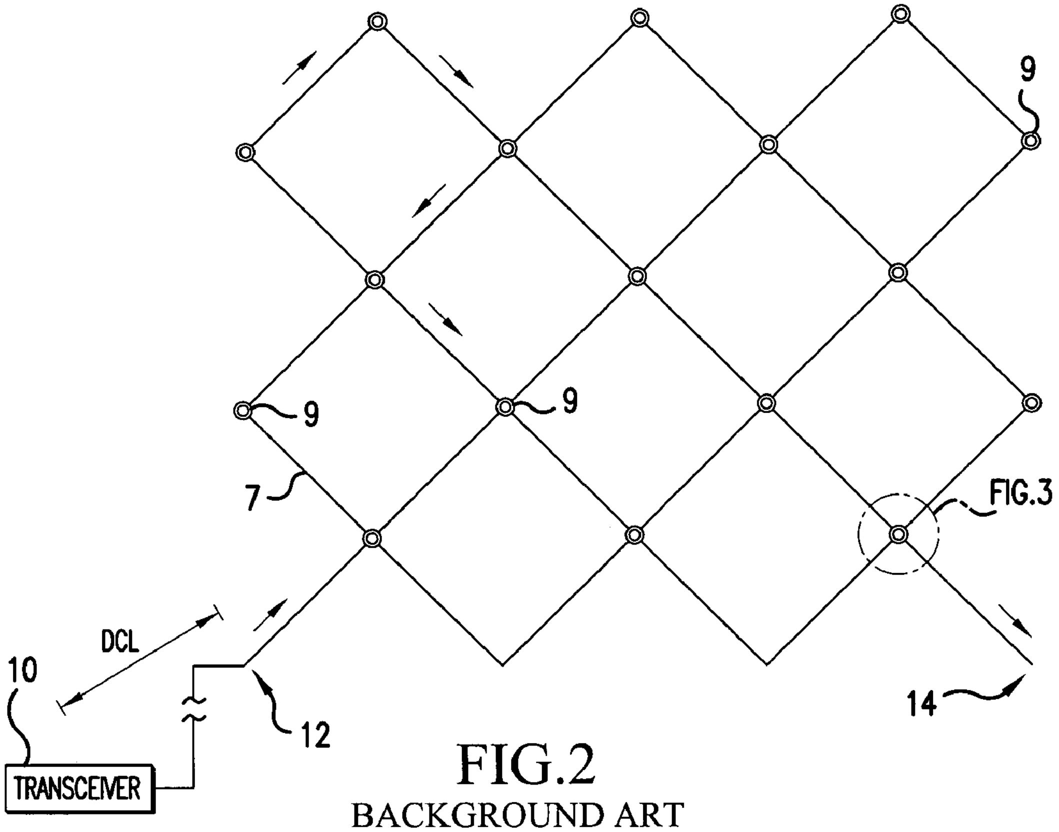
FIG.2 BACKGROUND ART
FIG. 2 is a close-up view of a fiber optic cable having a diamond-shaped weave pattern for attachment to the security fence of FIG. 1, in accordance with the background art.
Figure 3:
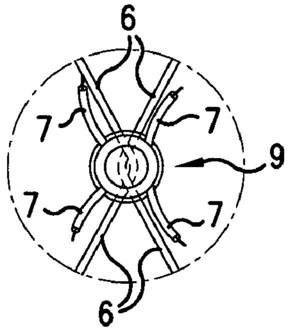
FIG.3 BACKGROUND ART
FIG. 3 is a close-up view of a connector used to hold the fiber optic cable in the diamond-shaped weave pattern and connected to the security fence, in accordance with the background art.

The present invention provides an improved system and method for more accurately detecting the location of a potential breach (PB) point in a fiber optic cable enhanced, security fence, such as the fence 1 illustrated in FIGS. 1–3. Reference will be made to FIGS. 4–7 to describe the system and method of the present invention.

Figure 4:
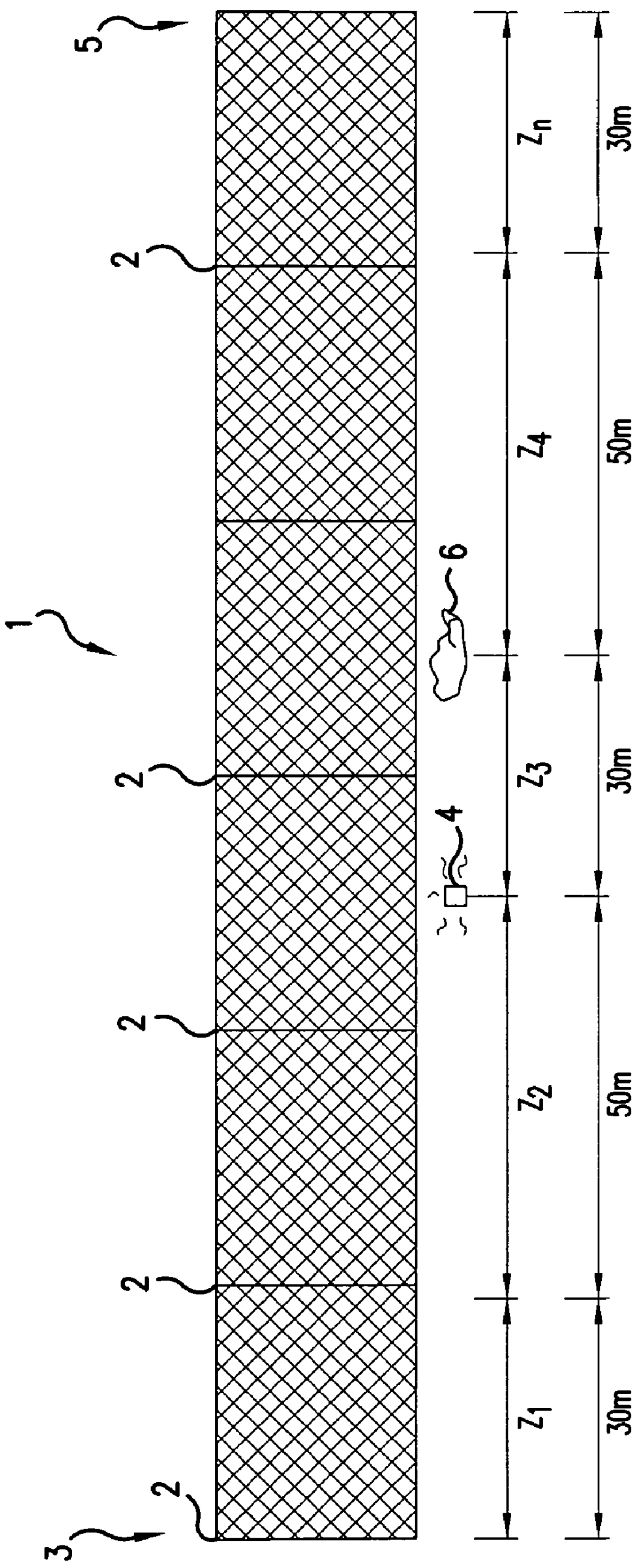
FIG. 4 is a perspective view of a chain-link security fence, in accordance with the present invention.

As illustrated in FIG. 4, the security fence 1, in accordance with the present invention, is divided into a plurality of zones Z1, Z2, Z3, Z4, . . . Zn. Each zone can be defined between posts 2 of the security fence 1, or between installed signals, such as light signals 4, or between natural objects, such as trees, streams, or rocks 6. As illustrated in FIG. 4, Zone Z1 is 30 meters in length and extends between two posts 2 of the security fence 1. Of course, there would most likely be several posts 2 residing within zone Z1, but for clarity's sake only the start and end posts 2 are illustrated. Zone 2 is 50 meters in length and extends between a fence post 2 and an installed light signal 4. Zone Z4 is also 50 meters in length and extends between a natural landmark, such as the rock 6 and a fence post 2.

Figure 5:
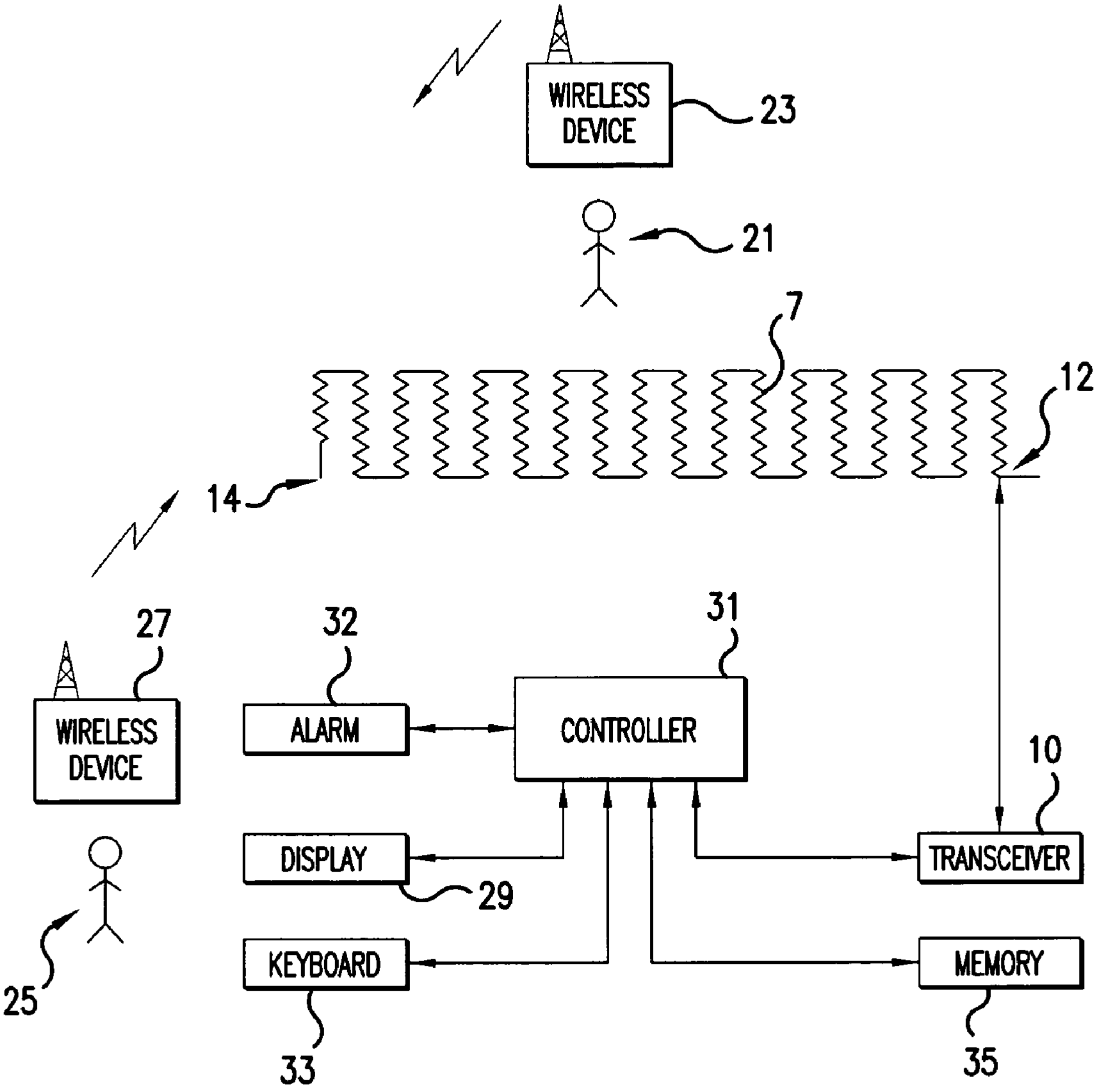
FIG. 5 is a block diagram of a system for building a look-Lip table to establish a monitoring system, in accordance with the present invention.

Next with reference to FIG. 5, a system and method of initializing a system for monitoring the security fence 1 will be described. A first person 21 is provided with a first wireless communications device 23, such as a cellular phone, or walkie-talkie radio. The first person 21 walks along the security fence 1. At the zone boundaries, the first person pinches, bends or stresses the fiber optic cable 7.

A second person 25 is located in a control center and is provided with a second wireless communications device 27. The first person 21 informs the second person 25 when the fiber optic cable 7 is bent and the particular zone boundary at which the bend is made. For example, the first person may state that the bend is being made at 160 meters from the start of the security fence 1, and that this location should be known as the start of zone 5. As another example, the first person may state that the bend is being made at 377 meters from the start of the fence, and that this location should be know as the start of zone 13, and is adjacent to a red and yellow marker staff.

The second person 25 views a display 29 connected to a controller 31. The controller 31 is connected to the transceiver 10. Because the fiber optic cable 7 is bent, the transceiver 10 will provide the second person 25 with the cable length to the bend, via an output of the display 29. The second person 25 enters data via a keyboard 33. The data may include the cable length determined by the transceiver 10, the ground distance provided by the first person 21 and an identifier for the zone boundary.

By repeating the process for each zone boundary, the second person 25 may enter data into a table format, which is retained in a memory 35 connected to the controller 31. The table establishes the zone boundaries as to: (1) their ground distance from the start of the fence; (2) the corresponding cable length from the transceiver to the start of the zone; and (3) any other relevant data, such as a marker identification or natural landmark which indicates the start of the zone. Table 1, set forth below, shows data entries for a security fence 1 covering an overall ground distance of 500 meters, and having ten zones. Of course, in practice the security fence could cover a much longer ground distance, have more zones, have zones of greater or shorter lengths, and have zones with varying lengths or uniform lengths.

TABLE 1

Look-Up Table for Zone Boundaries

| Zone Number | Starts at Ground Distance (GD) | Starts at Cable Length (CL) |
|---|---|---|
| 1 | 0 meters (m) | 325 m |
| 2 | 50 m | 840 m |
| 3 | 100 m | 1370 m |
| 4 | 130 m | 1805 m |
| 5 | 180 m | 2290 m |
| 6 | 230 m | 2800 m |
| 7 | 270 m | 3335 m |
| 8 | 300 m | 3825 m |
| 9 | 400 m | 4305 m |
| 10 | 450 m | 4750 m |

Figure 6:
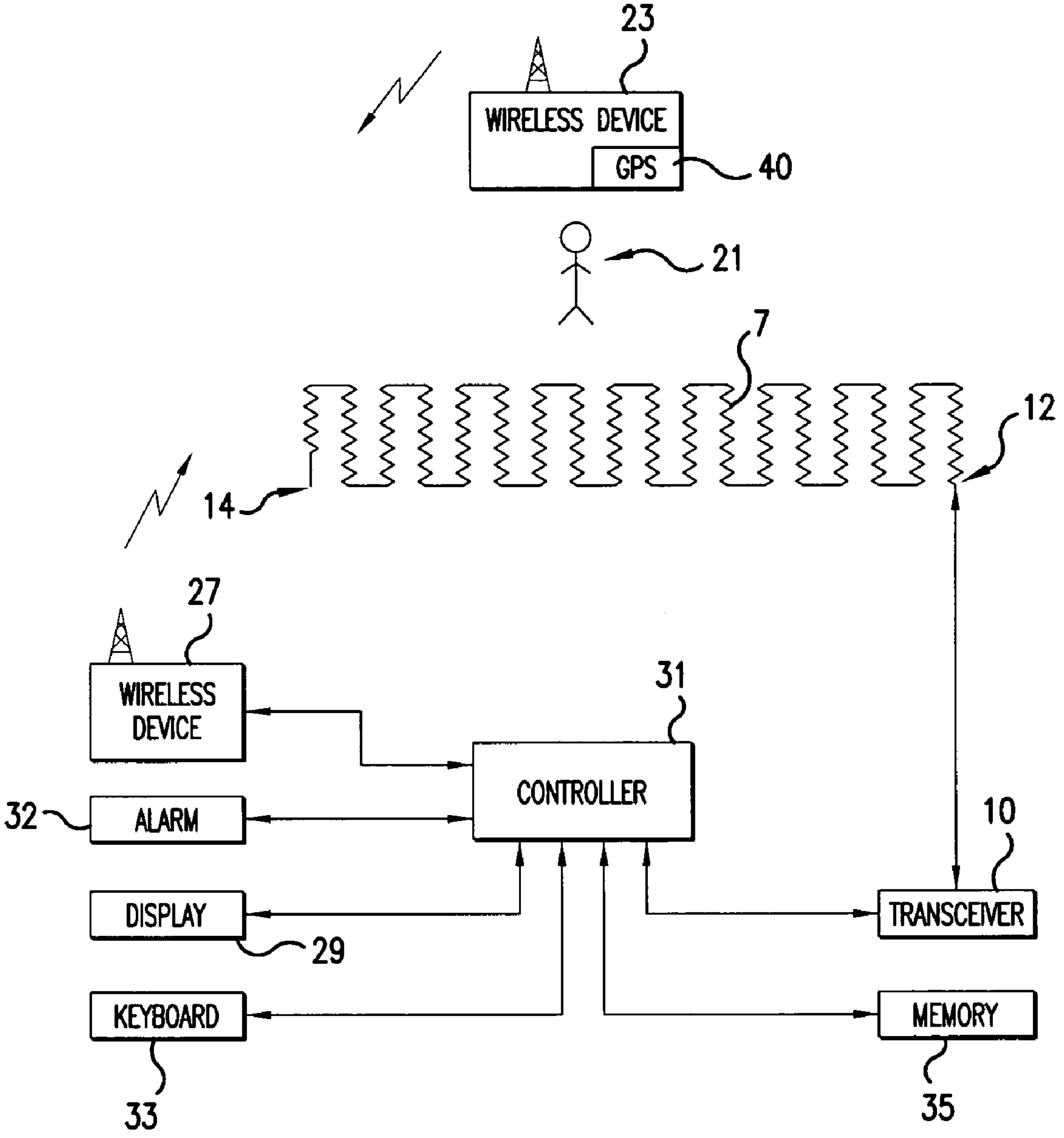
FIG. 6 is a block diagram of an alternative system for building the look-up table to establish the monitoring system.

The data table may be assembled in other manners, which would not require two persons. For example, as illustrated in FIG. 6, the second wireless communications device 27 may be directly or indirectly connected to the controller 31, and provide the first person 21 with direct access to the controller operations. In this instance, the second wireless communications device 27 would function in a manner similar to a wireless network router, and the first wireless communications device 23 would act as a linked device and would be capable of displaying data output to, and receiving data input from, the first person 21. For example, the first wireless communications device 23 could be a laptop computer or personal digital assistant (PDA), networked to the second wireless communications device 27. With the arrangement of FIG. 6, the first person 21 could build and store the data table in the memory 35 using the first wireless communications device 23. Also, the table could be completely built and initially stored in a memory within the first wireless communications device 23, to be later downloaded into the memory 35 connected to the controller 31. FIG. 6 also illustrates that a global positioning system (GPS) unit 40 may be included in the first wireless device 23. The GPS unit 40 could provide an accurate display or input of the ground distance from the reference point or start of the security fence 1, and hence relieve the first person 21 from making ground distance measurements using such devices as measuring roller wheels or range finders.

Figure 7:
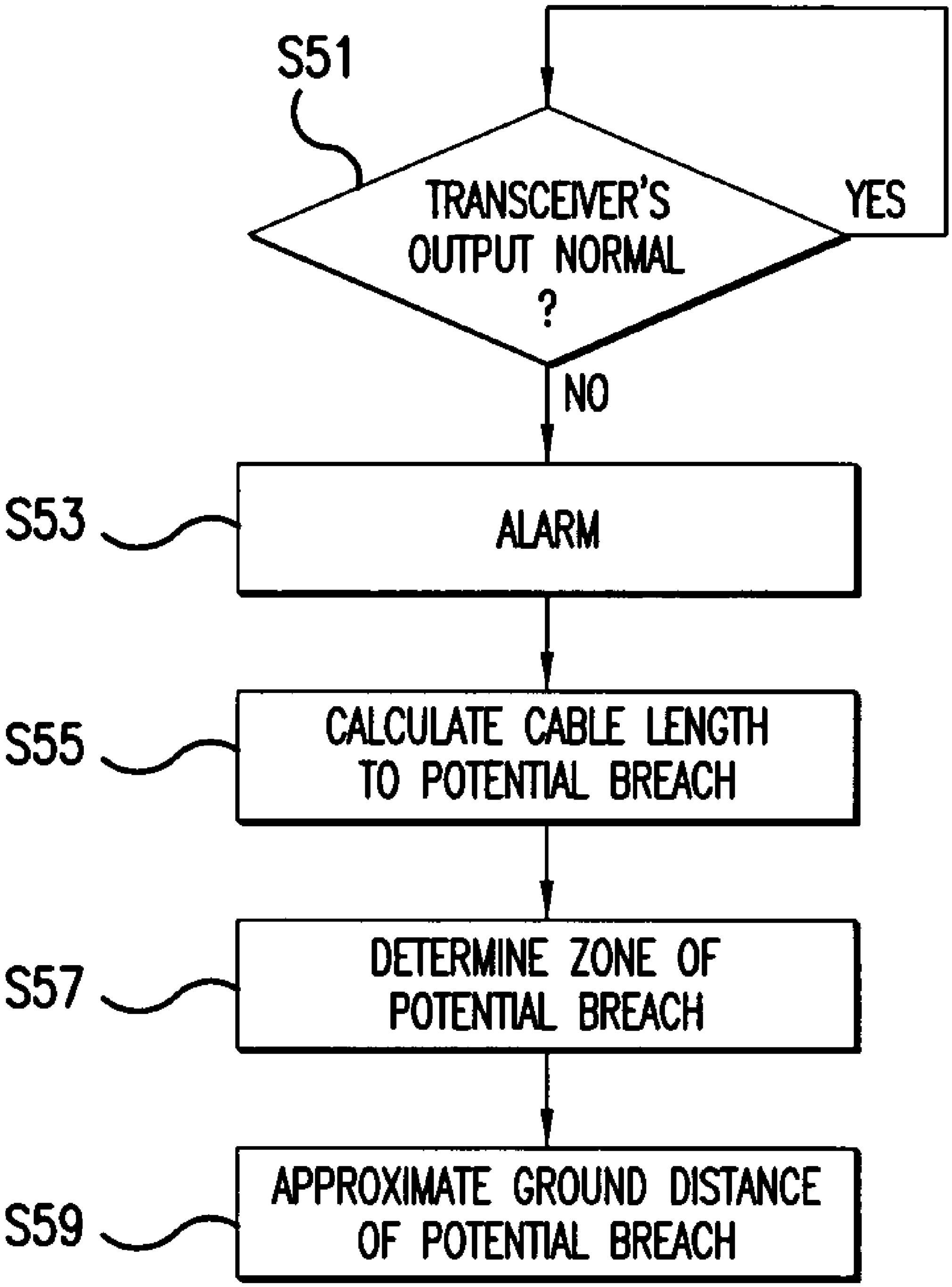
FIG. 7 is a flow chart illustrating a manner of operating the monitoring system of the present invention.

Once the data table has been built, the system is ready to operate. Next, an operating method for the security fence monitoring system will be described in connection with FIG. 7. FIG. 7 is a flow chart illustrating a method of operation for the controller 31 of FIGS. 5 and/or 6.

In step S51, the controller 31 is in a monitoring state. In the monitoring state, the controller 31 is constantly monitoring the output of the transceiver 10. The normal output of the transceiver 10 is an indication of the condition where a light signal has traveled to the end 14 of the fiber optic cable 7, reflected and returned to the transceiver 10. Hence, the normal output of the transceiver 10 is a time delay value indicative of this condition.

Once the transceiver 10 outputs a shorter time delay signal to the controller 31, an alarm is raised in step S53. The alarm may be given by a visual or audible alarm device 32 connected to the controller 31. Alternatively, the alarm may be a signal provided to a remote monitoring station, wherein the remote monitoring station will process the alarm signal, such as alerting onsite security personnel, activating cameras, automatically calling the police and property owner/manager, etc.

Next, in step S55, the controller converts the time delay signal provided by the transceiver 10 into a cable length value, in other words the cable length (CL) existing between the transceiver 10 and the point of potential breach (PB) in the fiber optic cable 7. The time delay can be converted into a cable length (CL) measurement by multiplying the time delay by the speed of the light transmitted through the fiber optic cable 7 (which is a known value), and dividing that product by two.

Next, in step S57, the CL value is compared to the lookup table stored in memory 35 to determine the zone of the PB point. For example, if the CL=2435 meters and table 1, above, is stored in the memory 35, the point of PB resides in zone 5. The identification of zone 5 can be made on display 29 and/or transmitted to the remote monitoring station.

Next, in step S59, an approximate location within zone 5 of the PB point is calculated. The approximate location of the PB point can be found using the following equations. First, the ground distance along the fence line within zone 5 is calculated by subtracting the ground distance to the start of zone 5 from the ground distance to the start of zone 6. In this case, 230 m−180 m=50 m.

Next, the cable length consumed in the weave pattern residing in zone 5 is calculated by subtracting the cable length at the start of zone 5 from the cable length at the start of zone 6. In this case, 2800 m−2290 m=510 m.

Next, the cable length within zone 5 from the start of zone 5 to the PB point is calculated by subtracting the cable length to the start of zone 5 from the CL to the PB point. In this case, 2435 m−2290 m=145 m.

Next, two ratios are equated and solved in order to calculate the ground distance of the PB point from the start of zone 5. In other words, the ratio of total cable length within a particular zone divided by total ground distance of that zone, is equated to the ratio of cable from the start of the zone to the PB point divided by ground distance from the start of the zone to the PB point, the last variable is the unknown variable to be determined. In this case, 510 m/50 m=145 m/X, where X is the approximate ground distance of the PB point from the start of zone 5. Here X=14.2 m, meaning that the PB point is located about 14.2 meters in ground distance from the start of zone 5, or alternately stated about 194.2 meters from the first end 3 of the security fence 1.

The method of determining the PB point along a security fence, in accordance with the above description offers many advantages over the background art. Primarily, the accuracy of the monitoring system is greatly enhanced, because there is no longer a reliance on an assumption that the fiber optic cable's weave pattern remains constant along the various portions of the security fence.

In practice, it is very difficult and time-consuming to ensure a consistent weave pattern density (cable length/ground distance covered) when installing a fiber optic cable along a security fence. Different persons may be installing the fiber optic cable at different portions of the security fence, the height of the security fence may change at various locations, natural or man-made objects may require alteration of the weave pattern (e.g. a 3 foot diameter drainage pipe passing through a security fence will prevent any fiber optic weave pattern within the cross sectional area it occupies). Hence, in the background art, the weave pattern density at any one point or portion of the fence section could vary greatly from the average value determined for that fence section.

Because of this variation, the background art's monitoring system could inaccurately predict the ground distance to the PB point. More importantly, when the fiber optic cable needed to be inspected or repaired, it took extended periods of time to locate the PB point.

The present invention has addressed the drawbacks of the background art's system. By the present invention, the location of a PB point will always certainly be known to within a certain zone. This is because the actual cable lengths to the zone boundaries are stored in a lookup table within a memory. The zone boundaries can be set very close together for enhanced accuracy. For example, when establishing the monitoring system for a 1000 meter section of fence, the first person 21 could "create" zone boundaries at 10 m intervals to establish approximately 100 zones, or at 20 meter intervals to establish approximately 50 zones, at the discretion of the user.

Moreover, by the present invention, the approximate location of a PB point within a zone is more accurately predicted, because there is a reliance upon an average weave pattern density for the zone having the PB point, rather than a reliance upon an average weave pattern density for the entire fence section. It is much more likely that the weave pattern density will be more uniform in any one particular zone, rather that the entire fence section.

The invention being thus described, it will be obvious that the same may be varied in many ways. For example, although the above description has referred to a transceiver 10 as a single device, it should be readily apparent that a distinct transmitter and a distinct receiver could be employed, in accordance with the present invention. As such, the term "light transmission and reception device," as used in the claims, is meant to encompass the arrangement of an integrally formed transceiver and the arrangement of distinct components, which accomplish an equivalent function. Such variations are not to be regarded as a departure from the spirit and scope of the invention, and all such modifications as would be obvious to one skilled in the art are to be included within the scope of the following claims.

What is claimed:

1. A method of calibrating a system for detecting a location of a potential breach along a security fence, the method comprising the steps of:

- providing a fiber optic cable along the security fence, with a light transmission and reception device attached to one end of the fiber optic cable;
- having a person move along the security fence;
- having the person interrupt light traveling through the fiber optic cable at a certain position;
- taking note of a ground distance between a reference point and the certain position;
- sensing the interruption in the fiber optic cable at the light transmission and reception device;
- determining an associated cable length existing between the light transmission and reception device and the interruption in the fiber optic cable; and
- recording the ground distance and the associated cable length in a memory.

2. The method according to claim 1, wherein the person takes note of the ground distance, and is considered to be a first person, and further comprising the steps of:

- the first person contacting a second person;
- the second person receiving communications from the light transmission and reception device;

the first person sending information to the second person including the ground distance; and the second person entering the ground distance and the associated cable length into the memory via a controller.

3. The method according to claim 2, wherein the second person manually enters at least one of the ground distance and the associated length into the memory via a keyboard connected to the controller.

4. The method according to claim 2, wherein the second person verbally enters at least one of the ground distance and the associated length into the memory via a microphone and voice recognition software ran by the controller.

5. The method according to claim 2, wherein the first person contacts the second person via a wireless communications device.

6. The method according to claim 1, further comprising the steps of:

providing the person who interrupts light traveling in the fiber optic cable with a first wireless communications device;

providing a second wireless device connected to a controller, the light transmission and reception device and the memory;

transmitting the ground distance from the first wireless communications device to the second wireless communications device; and the second wireless communications device providing the ground distance to a controller which stores the ground distance and the associated cable length in the memory.

7. The method according to claim 1, further comprising the steps of:

providing the person who interrupts light traveling in the fiber optic cable with a first wireless communications device connected to a controller;

connecting a second wireless communications device to the light transmission and reception device;

transmitting the associated cable length from the second wireless communications device to the first wireless communications device;

the first wireless communications device providing the associated cable length to the controller; and the controller storing the ground distance and associated cable length in the memory.

8. The method according to claim 5, wherein the ground distance is manually input into the first wireless communications device by the first person, and wherein the first person interrupts light traveling through the fiber optic cable by bending the cable.

9. The method according to claim 5, wherein the ground distance is automatically input into the first wireless communications device by an output of a global positioning system (GPS) connected to the first wireless communications device.

10. The method according to claim 1, wherein the transmission and reception device is an ODTR.

11. The method according to claim 1, wherein the reference point is the start of the security fence.

12. The method of claim 1, further comprising:

having the person interrupt light traveling through the fiber optic cable at different certain positions at different ground distances, in order to record a table of linked values of ground distances and associated cable lengths in the memory.

13. A calibration system for calibrating a monitoring system for detecting a location of a potential breach along a security fence, the calibration system comprising:

a fiber optic cable ran along a security fence;

a light transmission and reception device attached to one end of said fiber optic cable;

a controller attached to said light transmission and reception device;

a first wireless communications device operated by a first person moving along the security fence, after the first person interrupts light traveling through said fiber optic cable at a certain position, said first wireless communications device transmitting a ground distance from a reference point to the certain position;

a second wireless communications device receiving the ground distance from said first wireless communications device; and a memory connected to said controller, wherein said light transmission and reception device in cooperation with said controller determines an associated cable length existing between the light transmission and reception device and the interruption in the cable, and wherein said controller stores the ground distance and the associate cable length in said memory.

14. The system of claim 13, wherein said second wireless communication device is operated by a second person, who inputs the ground distance into said controller.

15. The system of claim 13, wherein said second wireless communications unit is connected to said controller.

16. The system of claim 13, wherein said first wireless communications unit includes a global positioning system (GPS) unit to determine the ground distance from the reference point.

17. An operating method for a security fence monitoring system comprising:

constantly monitoring an output of a light transmission and reception device to determine a time delay of a light signal passing through a fiber optic cable attached to a security fence;

if the time delay varies outside of a threshold value, issuing an alarm signal, and converting the time delay provided by the transceiver into a cable length value;

comparing the cable length value to a lookup table stored in a memory;

determining a zone of a potential breach point;

calculating an approximate location of the potential breach within the zone, wherein said step of calculating the approximate location of the potential breach within the zone is based upon an average weave pattern density of the fiber optic cable for the zone, which average weave pattern density differs from zone to zone and storing the calculated approximate location of the potential breach on a computer readable medium.

18. The method of claim 17, wherein the alarm signal causes activation of a visual or audible alarm device.

19. The method of claim 17, wherein the alarm signal and the zone of the potential breach point are sent to a remote monitoring station.

* * * * *